(12) United States Patent
Lin et al.

(10) Patent No.: US 12,525,524 B2
(45) Date of Patent: Jan. 13, 2026

(54) ELECTRONIC PACKAGE

(71) Applicant: SILICONWARE PRECISION INDUSTRIES CO., LTD., Taichung (TW)

(72) Inventors: Ching-Chih Lin, Taichung (TW); Wen-Hsin Wang, Taichung (TW); Chieh-Yi Hsieh, Taichung (TW); Shin-Yu Wang, Taichung (TW); Yi-Chien Huang, Taichung (TW); Hsiu-Fang Chien, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 506 days.

(21) Appl. No.: 17/981,763

(22) Filed: Nov. 7, 2022

(65) Prior Publication Data

US 2024/0047336 A1 Feb. 8, 2024

(30) Foreign Application Priority Data

Aug. 3, 2022 (TW) .................................. 111129166

(51) Int. Cl.
*H01L 23/498* (2006.01)
*H01L 23/00* (2006.01)

(52) U.S. Cl.
CPC .. *H01L 23/49838* (2013.01); *H01L 23/49816* (2013.01); *H01L 24/48* (2013.01);
(Continued)

(58) Field of Classification Search
CPC ......... H01L 23/49838; H01L 23/49816; H01L 23/49; H01L 24/48; H01L 24/49;
(Continued)

(56) References Cited

U.S. PATENT DOCUMENTS

| 5,444,303 | A | * | 8/1995 | Greenwood | ...... H01L 23/49838 |
| | | | | | 257/784 |
| 5,753,970 | A | * | 5/1998 | Rostoker | ........... H01L 23/49838 |
| | | | | | 257/784 |

(Continued)

FOREIGN PATENT DOCUMENTS

TW  I282133 B  *  6/2007
TW  I715234 B  *  1/2021

*Primary Examiner* — Teresa M. Arroyo
(74) *Attorney, Agent, or Firm* — Studebaker Brackett PLLC

(57) ABSTRACT

An electronic package is provided, in which an electronic element is arranged on a carrier structure having a plurality of wire-bonding pads arranged on a surface of the carrier structure, and a plurality of bonding wires are connected to a plurality of electrode pads of the electronic element and the plurality of wire-bonding pads. Further, among any three adjacent ones of the plurality of wire-bonding pads, a long-distanced first wire-bonding pad, a middle-distanced second wire-bonding pad and a short-distanced third wire-bonding pad are defined according to their distances from the electronic element. Therefore, even if the bonding wires on the first to third wire-bonding pads are impacted by an adhesive where a wire sweep phenomenon occurred when the flowing adhesive of a packaging layer covers the electronic element and the bonding wires, the bonding wires still would not contact each other, thereby avoiding short circuit problems.

9 Claims, 8 Drawing Sheets

(52) U.S. Cl.
CPC .... *H01L 24/49* (2013.01); *H01L 2224/48011* (2013.01); *H01L 2224/48091* (2013.01); *H01L 2224/48227* (2013.01); *H01L 2224/4903* (2013.01); *H01L 2224/49052* (2013.01); *H01L 2224/49176* (2013.01); *H01L 2924/182* (2013.01); *H01L 2924/3862* (2013.01)

(58) Field of Classification Search
CPC ........... H01L 24/85; H01L 2224/48011; H01L 2224/48091; H01L 2224/48227; H01L 2224/4903; H01L 2224/49052; H01L 2224/49176; H01L 2224/05013; H01L 2224/0555; H01L 2224/08054; H01L 2924/182; H01L 2924/3862
See application file for complete search history.

(56) References Cited

U.S. PATENT DOCUMENTS

| | | | | |
|---|---|---|---|---|
| 6,326,235 | B1 * | 12/2001 | Glenn | ...... H01L 24/78 |
| | | | | 257/E23.068 |
| 6,405,357 | B1 * | 6/2002 | Chao | ...... G06F 30/39 |
| | | | | 257/676 |
| 6,983,438 | B1 * | 1/2006 | Newman | ...... G06F 30/39 |
| | | | | 716/112 |

* cited by examiner

ELECTRONIC PACKAGE

BACKGROUND

1. Technical Field

The present disclosure relates to a semiconductor device, and more particularly, to an electronic package in the form of a wire-bonding package.

2. Description of Related Art

With the evolution of semiconductor manufacturing technology, more electronic elements are integrated into a semiconductor chip, so the number of input/output (I/O) connection terminals provided on the chip is increasing. Also, it is necessary to densely arrange a plurality of wire-bonding pads electrically connected to the input/output connection terminals on the package substrate for carrying semiconductor chip, so as to serve as the contacts of the semiconductor chip.

As shown in FIG. 1, in a semiconductor package 1, a semiconductor chip 11 is carried by and disposed on a package substrate 10, and electrode pads 110 of the semiconductor chip 11 are electrically connected to wire-bonding pads 100 of the package substrate 10 via a plurality of bonding wires 12, and an encapsulant 13 is formed on the package substrate 10 to encapsulate the semiconductor chip 11 and the bonding wires 12, wherein the size of each of the electrode pads 110 of the semiconductor chip 11 is extremely small due to the requirement of light, thin, short and small semiconductor package, so that a wire-bonding process needs to be performed between the extremely small-sized bonding wires 12 and the small wire-bonding pads 100, such that the surface of the package substrate 10 will present a high-density contact area full of wire-bonding pads 100 and an open area (e.g., at the corners of the package substrate 10) where the wire-bonding pads 100 are arranged sporadically.

However, during the process of forming the encapsulant 13, the bonding wires 12 corresponding to the open area are easily impacted by the flowing adhesive of the encapsulant 13, resulting in a wire sweep phenomenon. If the offset distance or the wire sweep distance of the bonding wires 12 is too large, the adjacent bonding wires 12 would be in contact with each other (e.g., the connection point k as shown in FIG. 1) and cause a short circuit, which may result in poor quality and reliability of the semiconductor package 1.

Therefore, there is a need for a solution that addresses the aforementioned shortcomings in the prior art.

SUMMARY

In view of the aforementioned shortcomings of the prior art, the present disclosure provides an electronic package, which comprises: a carrier structure having a plurality of wire-bonding pads arranged on a surface thereof, wherein each of the plurality of wire-bonding pads has a top surface in a symmetrical shape, and each of the plurality of wire-bonding pads defines a pad length and a pad width according to a geometric shape of the top surface; an electronic element disposed on the carrier structure, wherein among any three adjacent ones of the plurality of wire-bonding pads, a long-distanced first wire-bonding pad, a middle-distanced second wire-bonding pad and a short-distanced third wire-bonding pad are defined according to their distances from the electronic element; and a plurality of bonding wires respectively connected between the electronic element and each of the plurality of wire-bonding pads.

In the aforementioned electronic package, a first distance is defined between a center point of the first wire-bonding pad and a center point of the second wire-bonding pad along a horizontal direction, and the first distance is greater than or equal to the pad length.

In the aforementioned electronic package, a second distance is defined between a center point of the second wire-bonding pad and a center point of the third wire-bonding pad along a horizontal direction, and the second distance is greater than or equal to the pad length.

In the aforementioned electronic package, a third distance is defined between an edge of the second wire-bonding pad and an edge of the third wire-bonding pad, and wherein the third distance allows an imaginary circle with a diameter at least twice the pad width to be adjusted so as not to overlap any of the second wire-bonding pad and the third wire-bonding pad.

In the aforementioned electronic package, a fourth distance is defined between an edge of the first wire-bonding pad and an edge of the second wire-bonding pad, and wherein the fourth distance allows an imaginary circle with a diameter at least one and half times the pad width to be adjusted so as not to overlap any of the first wire-bonding pad and the second wire-bonding pad.

In the aforementioned electronic package, an adjacent fourth wire-bonding pad is arranged at an interval on the other side of the third wire-bonding pad relative to the second wire bonding pad, and a minimum distance between the third wire-bonding pad and the fourth wire-bonding pad in a vertical direction is served as a fifth distance. For example, the fifth distance is at least seven times the pad width.

In the aforementioned electronic package, the present disclosure further comprises a packaging layer covering the electronic element and the plurality of bonding wires.

In the aforementioned electronic package, the present disclosure further comprises a plurality of conductive elements formed on another surface of the carrier structure opposing a die placement area of the carrier structure.

As can be understood from the above, in the electronic package according to the present disclosure, a long-distanced first wire-bonding pad, a middle-distanced second wire-bonding pad and a short-distanced third wire-bonding pad are defined in any three adjacent ones of the plurality of wire-bonding pads according to their distances from the electronic element. Therefore, compared with the prior art, when the impact of the flowing adhesive of the packaging layer causes the bonding wires on the first to third wire-bonding pads to be offset (e.g., wire swept), even if the offset distances or the wire sweep distances of the bonding wires on the first to third wire-bonding pads are too great, the bonding wires will not contact each other and the problem of short circuit will not occur.

DETAILED DESCRIPTION

Figure 1:
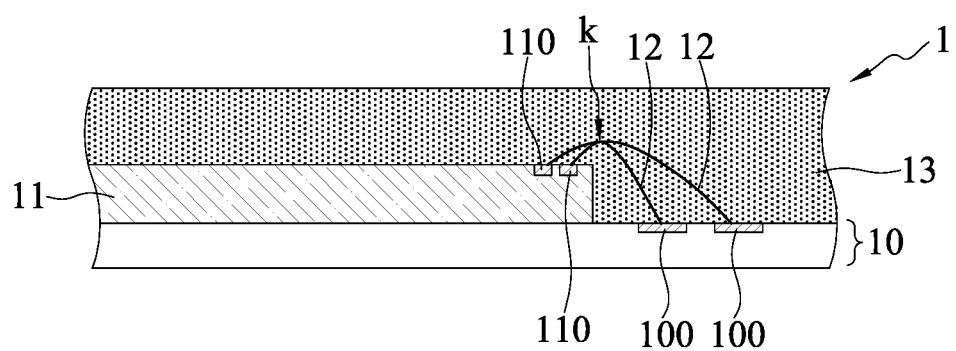
FIG. 1 is a schematic cross-sectional view of a conventional semiconductor package.

Implementations of the present disclosure are described below by embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios or sizes are construed as falling within the scope covered by the technical contents disclosed herein. Meanwhile, terms such as "above," "first," "second," "one," "a," "an," and the like, are for illustrative purposes, and are not meant to limit the scope implementable by the present disclosure. Any changes or adjustments made to the relative relationships, without substantially modifying the technical contents, are also to be construed as within the scope implementable by the present disclosure.

Figure 2A:
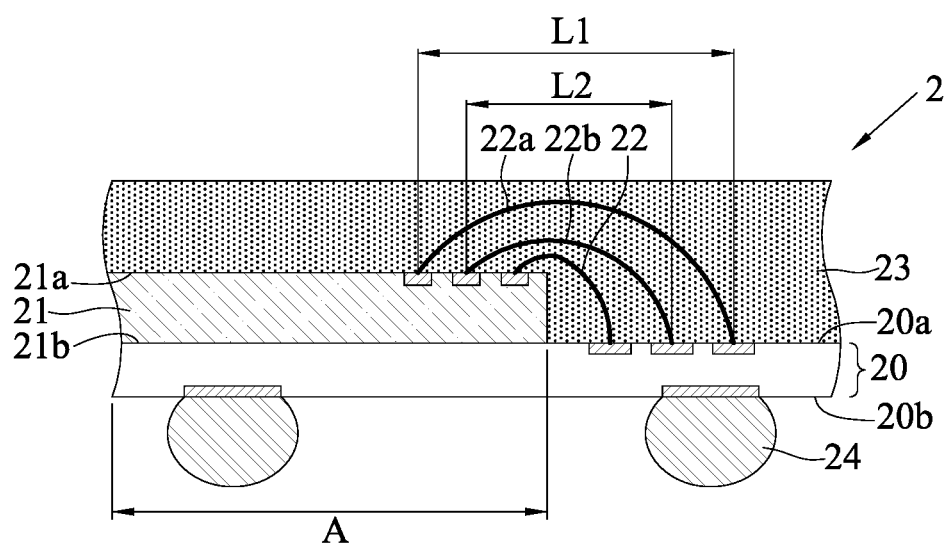
FIG. 2A is a schematic cross-sectional view of an electronic package according to the present disclosure.

FIG. 2A is a schematic cross-sectional view of an electronic package 2 according to the present disclosure. In an embodiment, the electronic package 2 is an aspect of a wire-bonding package.

As shown in FIG. 2A, the electronic package 2 comprises a carrier structure 20, at least one electronic element 21, a plurality of bonding wires 22 and a packaging layer 23.

Figure 2B:
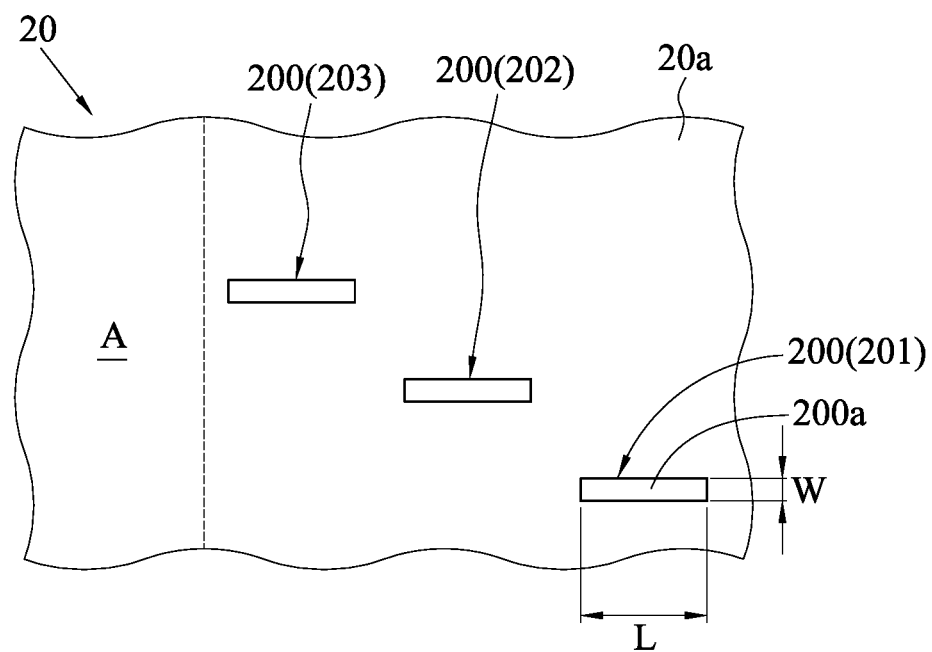
FIG. 2B is a schematic top plan view of FIG. 2A.
Figure 2C:
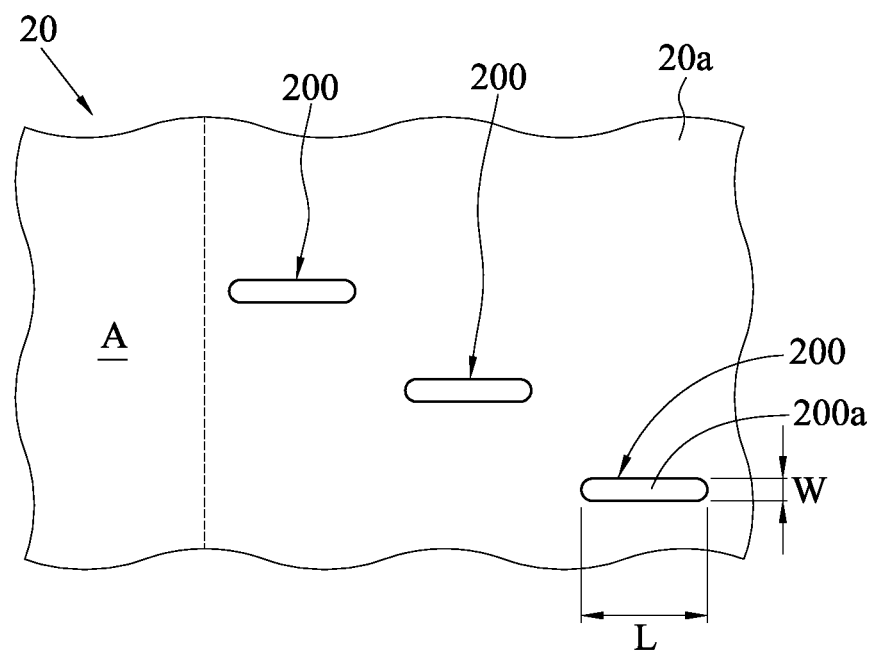
FIG. 2C is a schematic top plan view showing another aspect of FIG. 2B.

The carrier structure 20 has a die placement area A, and a plurality of wire-bonding pads 200 having the same shape are arranged on the periphery of the die placement area A, where a top surface 200a of the wire-bonding pad 200 is symmetrical in shape, such that the wire-bonding pad 200 defines the longest edge as a pad length L and the shortest edge as a pad width W according to the geometric shape of the top surface 200a (e.g., a rectangular shape as shown in FIG. 2B or a knuckle shape as shown in FIG. 2C), and the pad length L is greater than the pad width W. The geometric shape of the wire-bonding pad 200 is of a symmetrical pattern (e.g., the rectangle as shown in FIG. 2B) extending along a radial direction (e.g., a first direction X as shown in FIG. 2B) outward from the electronic element 21 (or the die placement area A) so as to define that the symmetrical pattern has a longest side distance (the maximum distance between the two opposite edges, e.g., the maximum distance between the two short sides as shown in FIG. 2B) along the radial direction, and to define that the pattern along a vertical direction of the radial direction (e.g., a first direction Y as shown in FIG. 2B) also has a longest side distance (the maximum distance between the two opposite edges, e.g., the maximum distance between the two long sides as shown in FIG. 2B). For example, the longest side distance corresponding to the radial direction is the pad length L, and the longest side distance corresponding to the vertical direction is the pad width W.

In an embodiment, the carrier structure 20 is a package substrate with a core layer and a circuit layer or a coreless package substrate. The carrier structure 20 includes at least one dielectric layer and a circuit layer bonded with the dielectric layer, and the outermost circuit layer is provided with wire-bonding pads. For example, the package substrate is fabricated in a manner of redistribution layer (RDL) fabrication method, wherein the material for forming the circuit layer is copper, and the material for forming the dielectric layer is a dielectric material such as polybenzoxazole (PBO), polyimide (PI), prepreg (PP), etc. It should be understood that the carrier structure 20 can also be other carrier boards for carrying the electronic elements 21 such as chips, and the present disclosure is not limited to as such.

Furthermore, the carrier structure 20 has a first surface 20a and a second surface opposing the first surface 20a, so that the first surface 20a is served as a die placement side for forming the die placement area A and the wire-bonding pads 200 to configure the electronic element 21, and the second surface 20b of the carrier structure 20 is served as a ball-placement side for forming a plurality of conductive elements 24 such as solder balls so as to bond the electronic package 2 onto a circuit board (not shown).

Also, the first surface 20a is defined with a first direction X and a second direction Y vertically adjacent the first direction X based on the die placement area A (e.g., rectangular shape or other geometric shapes), wherein the first direction X and the second direction Y are respectively parallel to the adjacent two sides of the die placement area A, as shown in FIG. 2B or FIG. 2C.

Figure 2D:
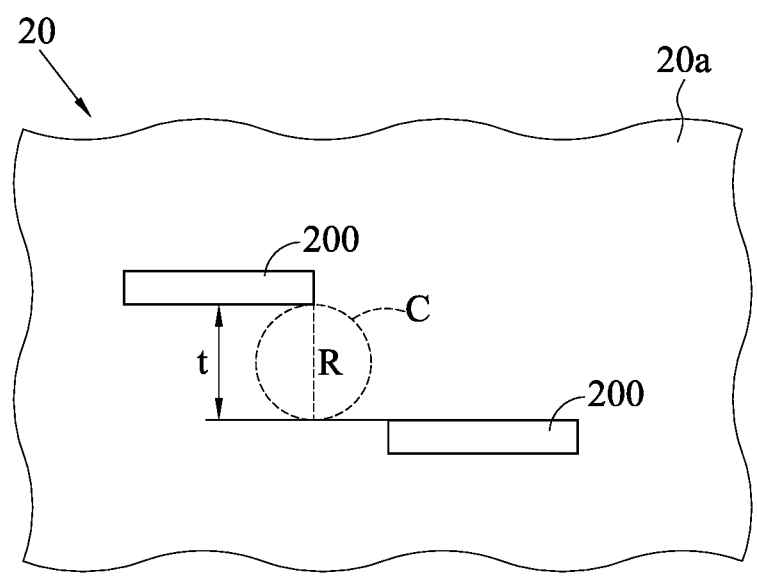
FIG. 2D is a schematic partial enlarged view of FIG. 2B.

In addition, the wire-bonding pads 200 are arranged at intervals on the first surface and since the top surface 200a of the wire-bonding pad 200 is in a symmetrical shape, there is a minimum distance t between the edges of any two adjacent ones of the wire-bonding pads 200. As shown in FIG. 2D, the minimum distance t allows an imaginary circle C whose diameter R is the pad width W to be adjusted so as not to overlap any of the two adjacent ones of the wire-bonding pads 200.

The electronic element 21 is disposed on the die placement area A of the first surface 20a of the carrier structure 20.

In an embodiment, the electronic element 21 is an active element, a passive element, or a combination of the active element and the passive element, etc., wherein the active element is such as a semiconductor chip, and the passive element is such as a resistor, a capacitor, or an inductor. For example, the electronic element 21 has an active surface 21a and an inactive surface 21b opposing the active surface 21a. Further, the active surface 21a has a plurality of electrode pads 210, and the electronic element 21 is bonded to the carrier structure 20 with the inactive surface 21b thereof via an adhesive layer (not shown), wherein the active surface 21a and the electrode pad 210 can be in any shape, such as a rectangular shape as shown in FIG. 3A.

Figure 3A:
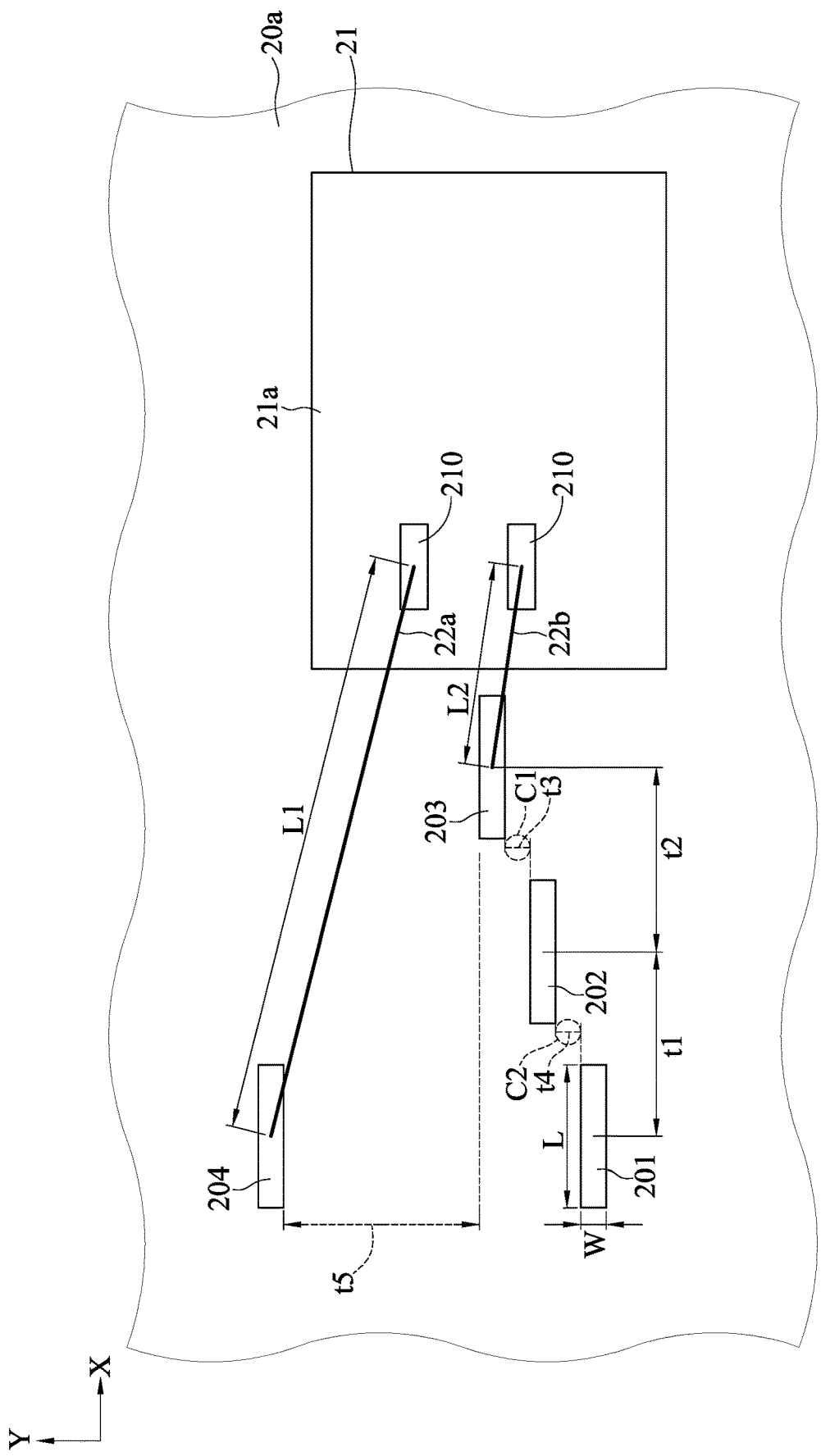
FIG. 3A and FIG. 3B are schematic top plan views showing different aspects of the electronic package according to the present disclosure.

Further, among any three adjacent ones of the plurality of wire-bonding pads 200, a long-distanced first wire-bonding pad 201, a middle-distanced second wire-bonding pad 202 and a short-distanced third wire-bonding pad 203 are defined according to their distances from the electronic element 21, as shown in FIG. 3A, so that a first distance t1 is defined along the first direction X (or horizontal direction) between a center point of the first wire-bonding pad 201 and a center point of the second wire-bonding pad 202; a second distance t2 is defined along the first direction X (or horizontal direction) between the center point of the second wire-bonding pad 202 and a center point of the third wire-bonding pad 203; a third distance t3 is defined between an edge of the second wire-bonding pad 202 and an edge of the third wire-bonding pad 203, where the third distance t3 allows an imaginary circle C1 whose diameter is the pad width W to be adjusted so as not to overlap any of the second wire-bonding pad 202 and the third wire-bonding pad 203; and a fourth distance t4 is defined between an edge of the first wire-bonding pad 201 and an edge of the second wire-bonding pad 202, where the fourth distance t4 allows an imaginary circle C2 whose diameter is the pad width W to be adjusted so as not to overlap any of the first wire-bonding pad 201 and the second wire-bonding pad 202.

For example, the first distance t1 is greater than or equal to the pad length L of the wire-bonding pad 200 (e.g., at least the pad length L), and the second distance t2 is greater than or equal to the pad length L of the wire-bonding pad 200 (e.g., at least the pad length L).

Also, another adjacent wire-bonding pad 200, which is defined as the fourth wire-bonding pad 204, is arranged at an interval on the other side of the third wire-bonding pad 203 relative to the second wire-bonding pad 202, and the minimum distance t between an edge of the third wire-bonding pad 203 and an edge of the fourth wire-bonding pad 204 in the vertical direction (e.g., a second direction Y) is served as a fifth distance t5. For example, the fifth distance t5 is at least seven times the pad width W. (i.e., t5≥7 W).

Figure 3B:
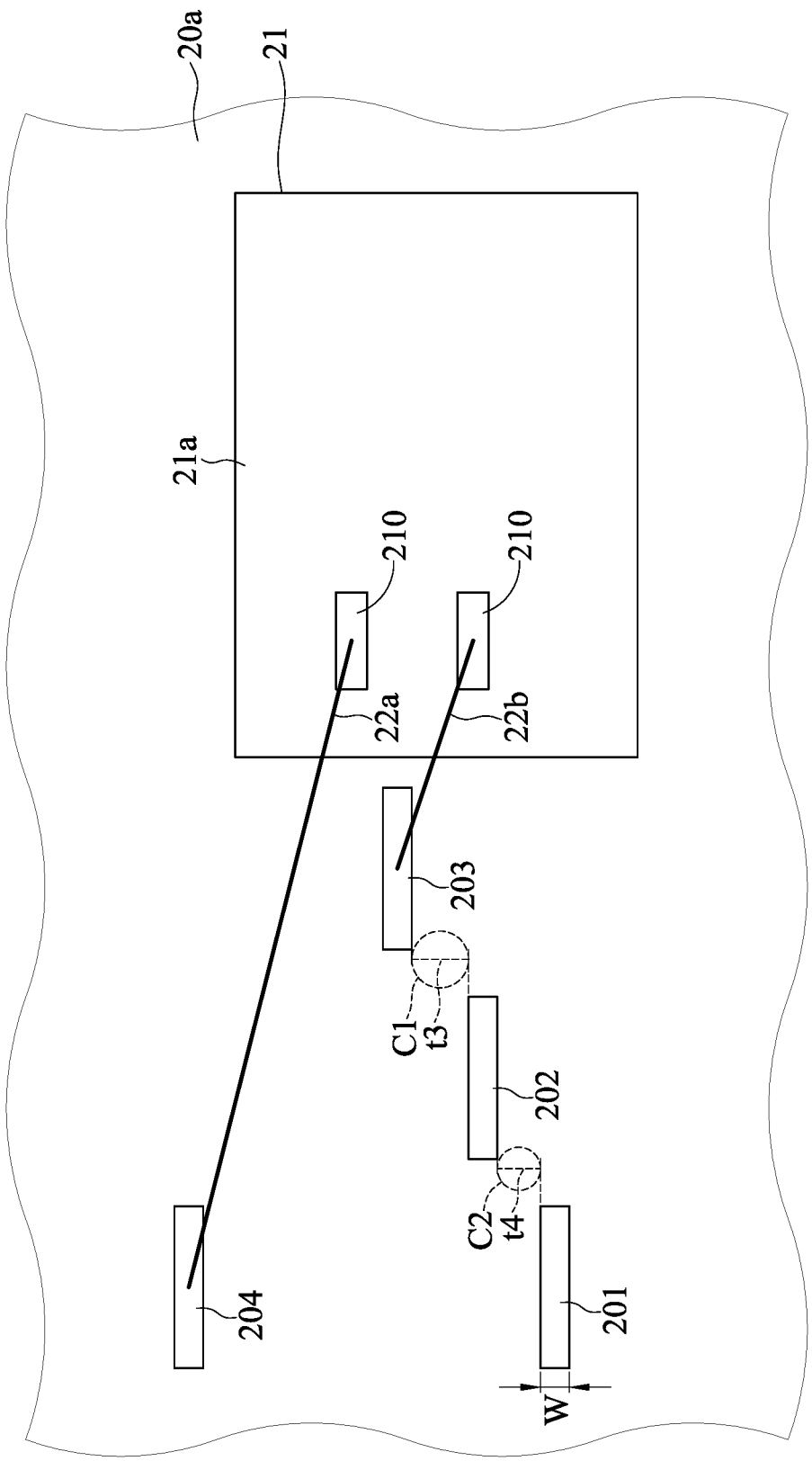

In addition, the aforementioned distances can be adjusted according to requirements. For example, as shown in FIG. 3B, the third distance t3 between the edge of the second wire-bonding pad 202 and the edge of the third wire-bonding pad 203 allows the imaginary circle C1 with a diameter at least twice the pad width W to be adjusted so as not to overlap any of the second wire-bonding pad 202 and the third wire-bonding pad 203, and the fourth distance t4 between the edge of the first wire-bonding pad 201 and the edge of the second wire-bonding pad 202 allows the imaginary circle C2 with a diameter at least one and half times the pad width W to be adjusted so as not to overlap any of the first wire-bonding pad 201 and the second wire-bonding pad 202.

Moreover, the plurality of bonding wires 22 are connected to the plurality of electrode pads 210 and the plurality of wire-bonding pads 200 so as to electrically conduct the electronic element 21 and the carrier structure 20.

In an embodiment, the bonding wires 22 are gold wires or made from other suitable materials, and any two adjacent ones of the bonding wires 22 can be defined as a first bonding wire 22a and a second bonding wire 22b according to wire-bonding distances, as shown in FIG. 3A. For example, the first bonding wire 22a is a long arc, which connects the fourth wire-bonding pad 204 and the electrode pad 210, and the second bonding wire 22b is a short arc, which connects the third wire-bonding pad 203 and the electrode pad 210.

Furthermore, a ratio of a projected length L1 of the first bonding wire 22a (long arc) relative to the first surface 20a and/or a projected length L2 of the second bonding wire 22b (short arc) relative to the first surface 20a to the fifth distance t5 is at least seven (L1/t5≥7 and/or L2/t5≥7).

In addition, the packaging layer 23 is formed on the first surface 20a of the carrier structure 20 to cover the electronic element 21 and the bonding wires 22.

In an embodiment, the packaging layer 23 is made from an insulating material, such as polyimide (PI), dry film, encapsulant such as epoxy resin, or molding compound. For example, the packaging layer 23 can be formed on the carrier structure 20 in a manner of liquid compound, injection, lamination, or compression molding.

Therefore, in the electronic package 2 of the present disclosure, the three consecutively adjacent wire-bonding pads 200 are located at places with long, medium and short distances from the electronic element 21 respectively, so that when the bonding wires 22 are offset (e.g., wire swept) due to the impact of the flowing adhesive of the packaging layer 23 (especially the corners of the first surface 20a of the carrier structure 20 or the open area where the wire-bonding pads 200 are arranged), the two adjacent bonding wires 22 will not contact each other even if the offset distance or the wire sweep distance of the bonding wires 22 is too great, such that the problem of short circuit will not occur.

Furthermore, the fifth distance t5 is at least seven times the pad width W of the wire-bonding pad 200 (i.e., t5≥7 W); a ratio of the projected length L1 of the first bonding wire 22a relative to the first surface 20a and/or the projected length L2 of the second bonding wire 22b relative to the first surface 20a to the fifth distance t5 is at least seven (L1/t5≥7 and/or L2/t5≥7); the first distance t1 is greater than or equal to the pad length L of the wire-bonding pad 200 (e.g., at least the pad length L), and the second distance t2 is greater than or equal to the pad length L of the wire-bonding pad 200 (e.g., at least the pad length L); alternatively, the third distance t3 is twice the pad width W (i.e., t3=2 W), and the fourth distance t4 is one and half times the pad width W (i.e., t4=1.5 W) and so on. Any of the aforementioned ways of arranging the wire-bonding pads 200 is more effective to avoid the occurrence of contact between two adjacent ones of the bonding wires 22.

Figure 4:
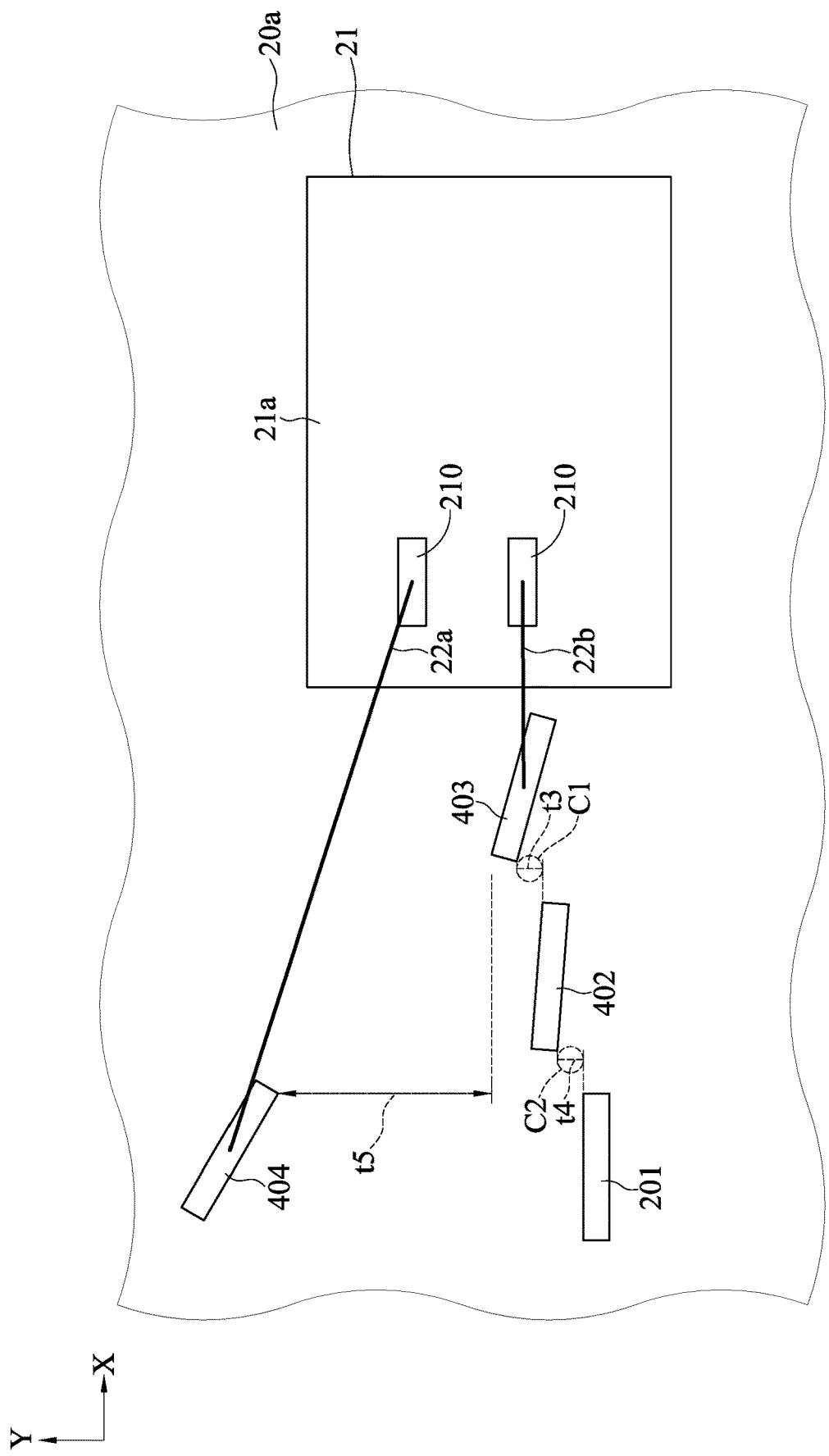
FIG. 4 is a schematic top plan view showing another embodiment of the electronic package according to the present disclosure.

It can be understood that the first wire-bonding pad 201, the second wire-bonding pad 202 and the third wire-bonding pad 203 (even the fourth wire-bonding pad 204) are arranged in parallel to each other to facilitate the design of the aforementioned distances. However, if at least two of the first wire-bonding pad 201, the second wire-bonding pad 402 and the third wire-bonding pad 403 (or even the fourth wire-bonding pad 404) are arranged non-parallel to each other, the distance between the closest edges of the two wire bonding pads is served as the third distance t3 or the fourth distance t4, where the third distance t3 or the fourth distance t4 allows the imaginary circle C1, C2 whose diameter is the pad width W to be adjusted so as not to overlap any of the two wire bonding pads, as shown in FIG. 4, and the distance between the closest edges of the third wire-bonding pad 403 and the fourth wire-bonding pad 404 is served as the fifth distance t5.

In view of the above, in the electronic package of the present disclosure, the problem of short circuit caused by the wire sweep phenomenon of the bonding wires due to the impact of the flowing adhesive material of the packaging layer is avoided by adjusting the position of the wire-bonding pads and the distance between the wire-bonding pads. Therefore, compared with the prior art, the quality and the reliability of the electronic package of the present disclosure can be effectively improved.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed by the present disclosure should be defined by the following claims.

What is claimed is:

1. An electronic package, comprising:
   a carrier structure having a plurality of wire-bonding pads arranged on a surface thereof, wherein each of the plurality of wire-bonding pads has a top surface in a symmetrical shape, wherein each of the plurality of wire-bonding pads defines a pad length and a pad width according to a geometric shape of the top surface, and wherein each of the plurality of wire-bonding pads has the same pad length and the same pad width;
   an electronic element disposed on the carrier structure, wherein among any three adjacent ones of the plurality of wire-bonding pads, a long-distanced first wire-bonding pad, a middle-distanced second wire-bonding pad and a short-distanced third wire-bonding pad are defined according to their distances from the electronic element; and
   a plurality of bonding wires respectively connected between the electronic element and each of the plurality of wire-bonding pads, wherein a fourth distance between an edge of the first wire-bonding pad and an edge of the second wire-bonding pad is equivalent to a circle with a diameter at least one and half times the pad width so as not to overlap any of the first wire-bonding pad and the second wire-bonding pad.

2. The electronic package of claim 1, wherein a first distance is defined between a center point of the first wire-bonding pad and a center point of the second wire-bonding pad along a horizontal direction, and the first distance is greater than or equal to the pad length.

3. The electronic package of claim 1, wherein a second distance is defined between a center point of the second wire-bonding pad and a center point of the third wire-bonding pad along a horizontal direction, and the second distance is greater than or equal to the pad length.

4. The electronic package of claim 1, wherein a third distance is defined between another edge of the second wire-bonding pad and an edge of the third wire-bonding pad, and wherein the third distance is equivalent to a circle with a diameter at least twice the pad width so as not to overlap any of the second wire-bonding pad and the third wire-bonding pad.

5. The electronic package of claim 1, wherein an adjacent fourth wire-bonding pad is arranged at an interval on the other side of the third wire-bonding pad relative to the second wire bonding pad, and a minimum distance between the third wire-bonding pad and the fourth wire-bonding pad in a vertical direction is served as a fifth distance.

6. The electronic package of claim 5, wherein the fifth distance is at least seven times the pad width.

7. The electronic package of claim 5, wherein a ratio of a projected length of at least one of the plurality of bonding wires relative to the surface of the carrier structure to the fifth distance is at least seven.

8. The electronic package of claim 1, further comprising a packaging layer covering the electronic element and the plurality of bonding wires.

9. The electronic package of claim 1, further comprising a plurality of conductive elements formed on another surface of the carrier structure opposing a die placement area of the carrier structure.

* * * * *